United States Patent [19]

Song

[11] Patent Number: 5,616,942
[45] Date of Patent: Apr. 1, 1997

[54] FLASH EEPROM CELL AND MANUFACTURING METHODS THEREOF

[75] Inventor: Bok N. Song, Kyungki-Do, Rep. of Korea

[73] Assignee: Hyundai Electronics Industries Co., Ltd., Kyungki-Do, Rep. of Korea

[21] Appl. No.: 622,757

[22] Filed: Mar. 27, 1996

[30] Foreign Application Priority Data

Mar. 28, 1995 [KR] Rep. of Korea ............. 95-6666

[51] Int. Cl.⁶ .................. H01L 29/788; H01L 29/76
[52] U.S. Cl. ................... 257/316; 257/317; 257/319; 257/321; 257/322
[58] Field of Search ................. 257/316, 317, 257/319, 321, 322

[56] References Cited

U.S. PATENT DOCUMENTS 4,363,109  12/1982  Gardner, Jr. .
5,055,897  10/1991  Canepa et al. .
5,218,571   6/1993  Norris ..................... 365/189.09
5,253,196  10/1993  Shimabukuro et al. ........... 365/45
5,300,803   4/1994  Lin ............................ 257/322
5,465,231  11/1995  Ohsaki ..................... 365/185.33

*Primary Examiner*—Ngan V. Ngo
*Attorney, Agent, or Firm*—Fish & Richardson P.C.

[57] ABSTRACT

This invention relates to a flash EEPROM(Electrically Erasable Programmable Read-Only Memory) cell, more particularly to the cell having an inverter structure with an n-channel part and a p-channel part which hold a floating gate in common, in which the floating gate is charged with hot electrons produced in the n-channel part in programming and the floating gate is neutralized or inverted with hot holes produced in the p-channel part in erasing.

1 Claim, 6 Drawing Sheets

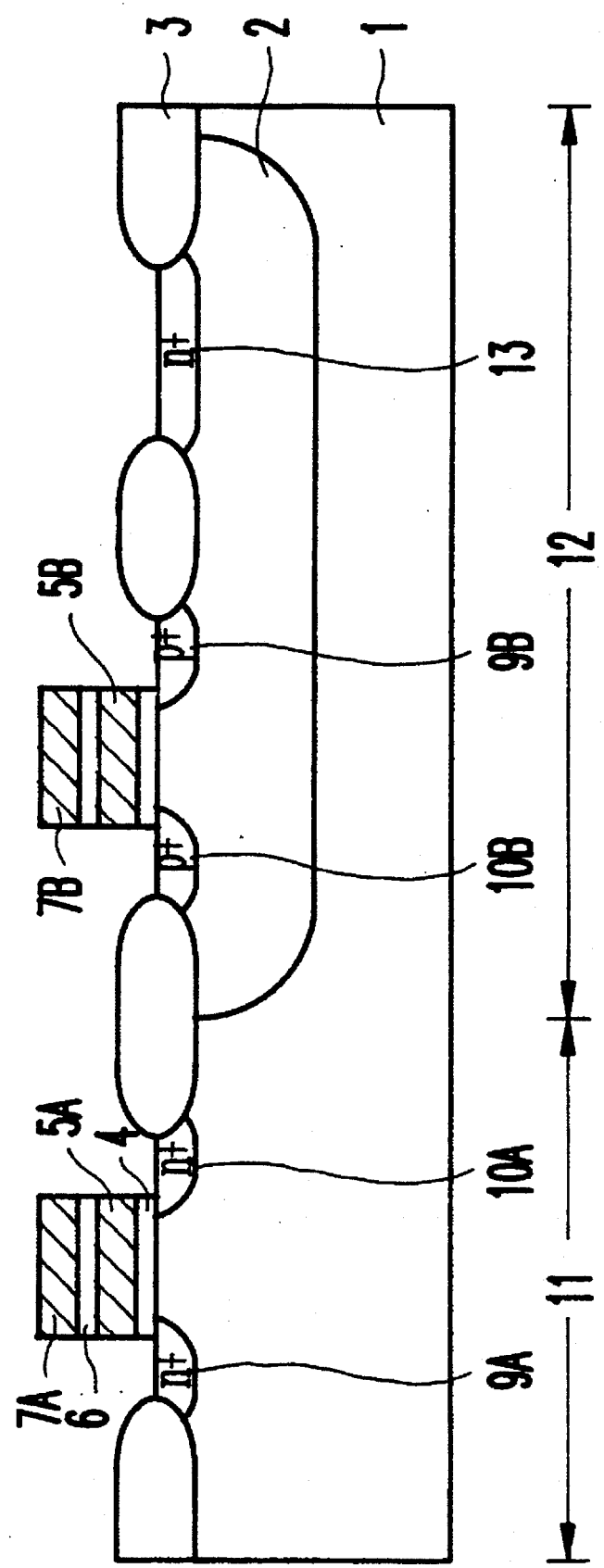

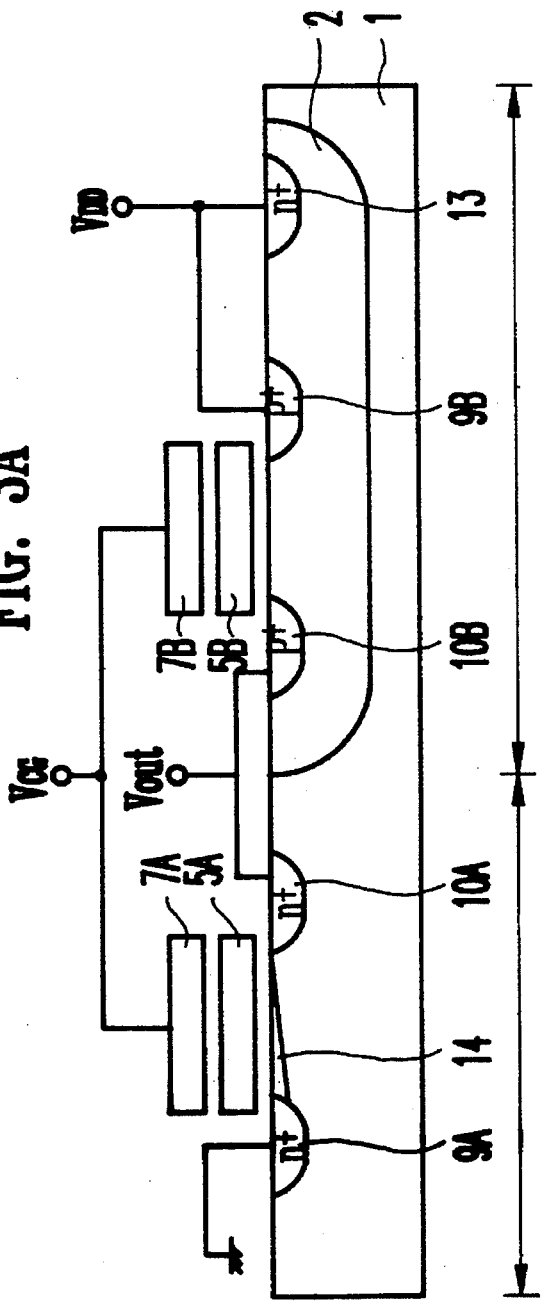
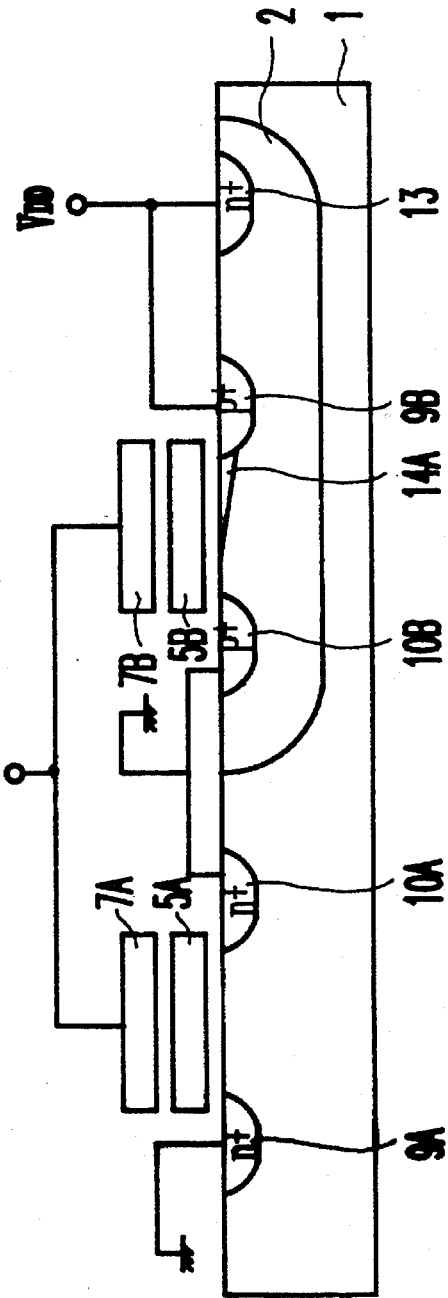

5,616,942

FLASH EEPROM CELL AND MANUFACTURING METHODS THEREOF

BACKGROUND OF THE INVENTION

Field of the Invention

This invention relates to a flash EEPROM(Electrically Erasable Programmable Read-Only Memory) cell, and manufacturing methods thereof, more particularly to the cell having an inverter structure with an n-channel part and a p-channel part which hold a floating gate in common.

INFORMATION DISCLOSURE STATEMENT

In a non-volatile memory cell like a flash EEPROM(referred to as the cell below), one of the most severe disadvantages is that the time to be taken to erase the cell is much longer than the time to be taken to program same cell for example, about 1,000 times. In programming the cell, as a physical phenomenon so called "hot carrier injection" that has a high efficiency for the program is used it takes only several tens of micro($\mu$) seconds. However, due to the use of tunneling mechanism with very low efficiency, several tens of milli(m) seconds are required in an erasing stage. So the difference of the required time between program and erasure is at least 1000 times so that it results in severe asymmetry in time to be required to program and erase information. And also a thin insulating film of thickness of about 100Å that is required for tunneling becomes another barrier in view of reliability.

SUMMARY OF THE INVENTION

It is an object of the present invention to provide a flash EEPROM cell and method of manufacturing the same which can solve the above shortcomings. Another object of the invention is that it provides a flash EEPROM cell having an inverter with an n-channel part and a p-channel part holding a floating gate in common, in which the floating gate is charged with hot electrons produced in the n-channel part in programming and the floating gate is neutralized or inverted with hot holes produced in the p-channel part in erasing.

To accomplish the above objects, a flash EEPROM cell according to the present invention, comprise: a first source and a first drain formed in a p-type silicon substrate; a second source and a second drain formed in an n-well of said p-type silicon substrate, with said second source connecting to said first drain; a first tunnel oxide and a second tunnel oxide formed on said p-type silicon substrate between said first source and said first drain, and said p-type silicon substrate between said second source and said second drain respectively; a first floating gate and a second floating gate formed on said first and second tunnel oxides, respectively, wherein said first floating gate is connected to said second floating gate; a first insulating film and a second insulating film formed on said first and second floating gates, respectively; and a first control gate and a second control gate formed on said first and second insulating films, respectively, with said first control gate connecting to said second control gate. And a method of manufacturing a flash EEPROM cell, comprises the steps of: forming an n-well in a p-type silicon substrate; forming a field oxide film to isolate devices: sequentially forming a first insulating film and a first polysilicon film and a second insulating film and a second polysilicon film on the resulting structure after forming said field oxide film; forming control gates and floating gates of an n-channel part and a p-channel part by sequentially etching a portion of said second polysilicon and said second insulating film and said first polysilicon film and said first insulating film so that said control gates are connected each other and said floating gates are connected each other; forming a source and a drain of the n-channel part and a pickup region in the n-well; and forming a source and a drain of the p-channel part connecting said drain of said n-channel part to said drain of said p-channel part.

BRIEF DESCRIPTION OF THE DRAWINGS

For fuller understanding of the nature and objects of the invention, reference should be had to the following detailed description taken in conjunction with the accompanying drawing in which:

FIGS. 1A through 1C are cross-sectional views for explaining a method of manufacturing an EEPROM cell in accordance with the present invention;

FIGS. 3A through 3C are cross-sectional views to show the bias conditions for the cell operation.

Similar reference characters refer to similar parts through the several views of the drawings.

DETAILED DESCRIPTION OF THE INVENTION

Figure 1A:
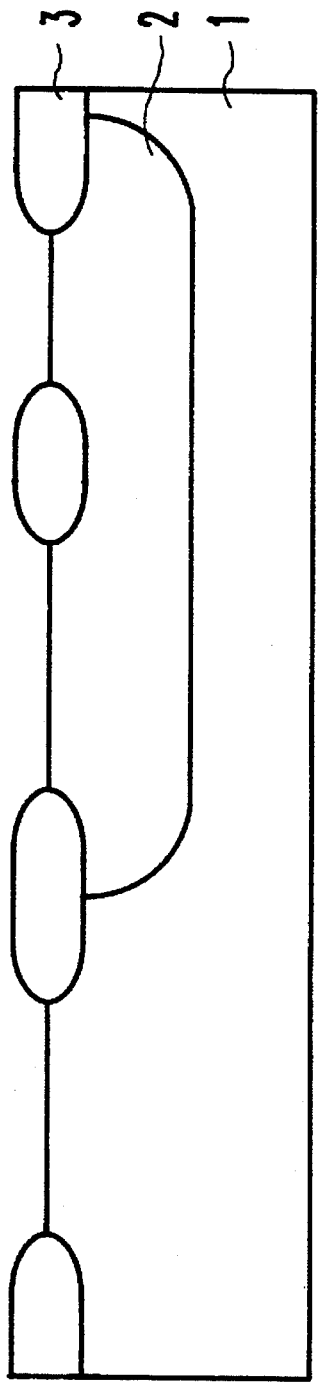
Figure 1B:
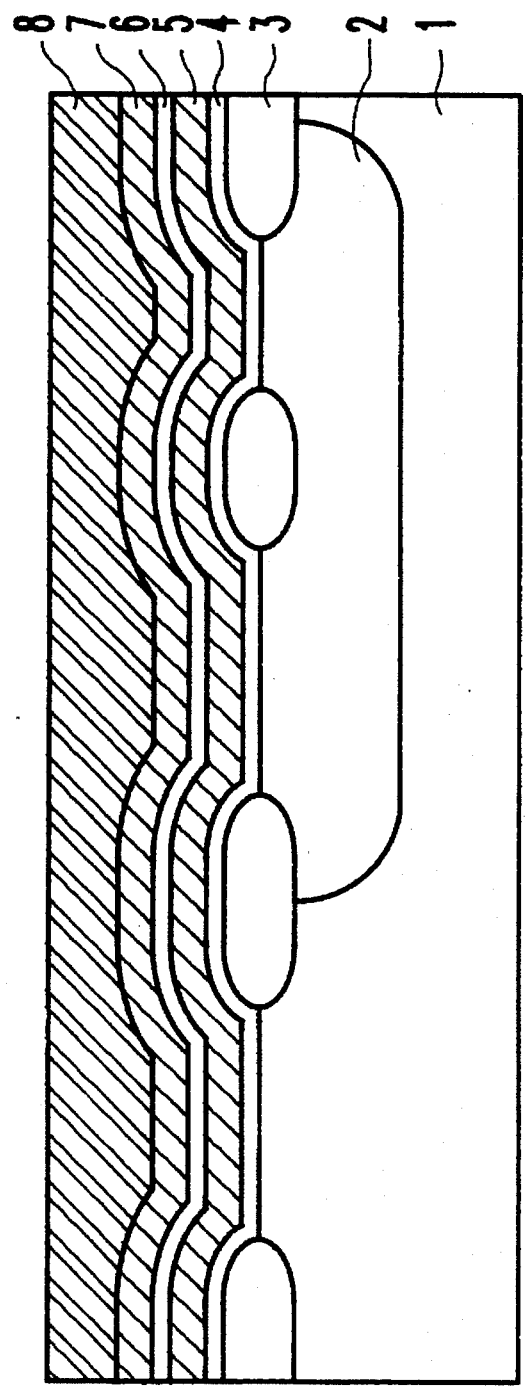

FIGS. 1A through 1C are cross-sectional views for explaining the method of manufacturing an EEPROM cell in accordance with the present invention.

FIG. 1A illustrates that an n-well(2) is formed by injecting n-type ion impurities in a p-type silicon substrate(1), and a field oxide film(3) is formed by a LOCOS process to isolate devices.

In FIG. 1B, a first insulating film(4), first polysilicon film(5), a second insulating film(6), a second polysilicon film(7), and a photo-resist film(8) are sequentially formed on the p-type silicon substrate.

Referring to FIG. 1C, after patterning the photo-resist film(8) using a mask for a gate electrode, control gates(7A and 7B) and floating gates(5A and 5B) of an n-channel part(11) and a p-channel part(12) are formed by sequentially self-aligning etching the second polysilicon film(7), the second insulating film(6), the first polysilicon film(5), and the first insulating film(4) using the patterned photo-resist film(8) as a mask, in which the control gates and the floating gates are overlapped. And then a source(9A), a drain(10A), and a pickup region(13) are made to form the n-channel part(11) by implanting n-type ion impurities. Then a source(9B), and a drain(10B) of the p-channel part are formed by implanting p-type ion impurities.

Figure 2:
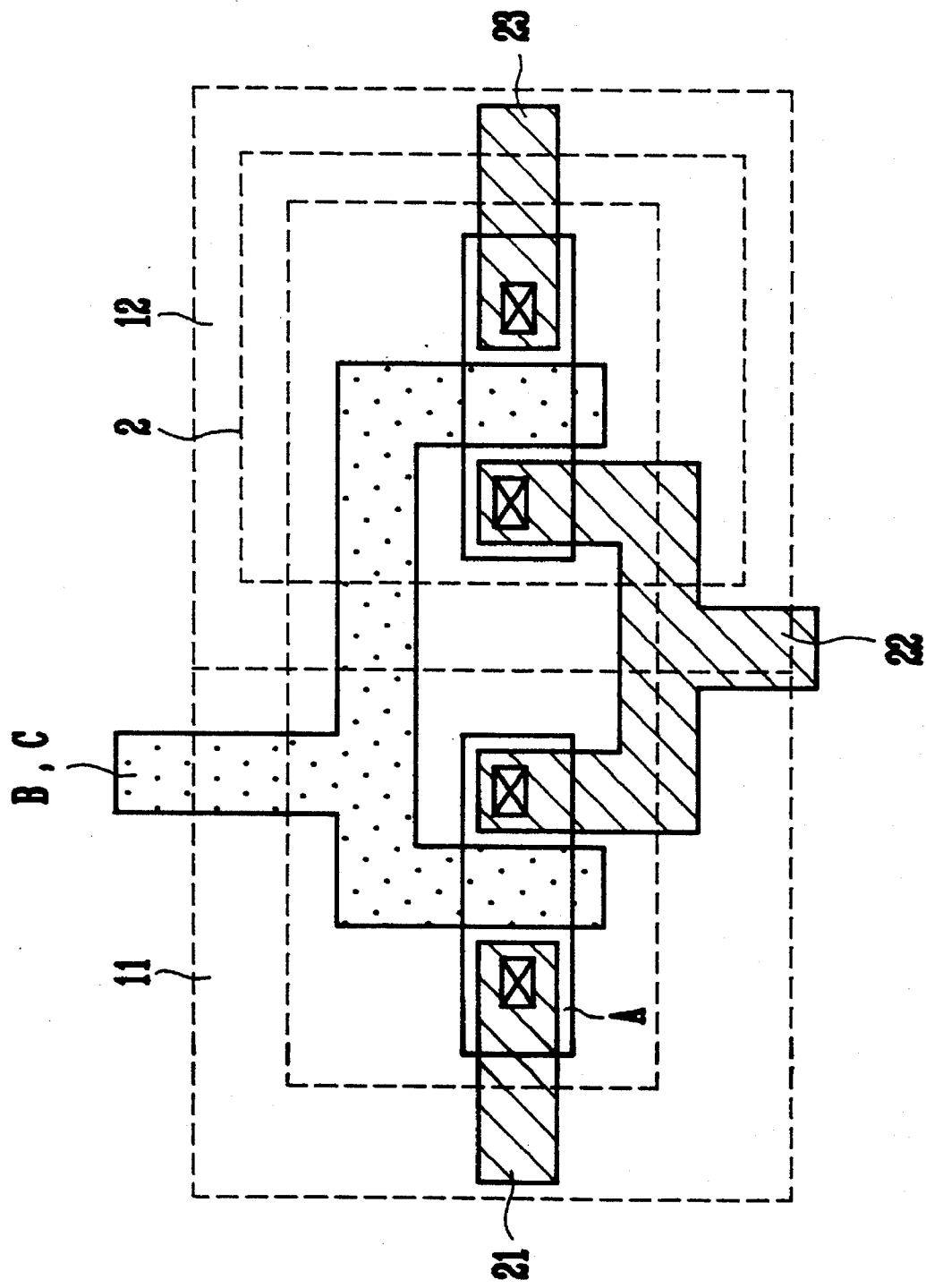
FIG. 2 is a layout of the EEPROM cell according to the present invention.

FIG. 2 is a layout of the cell according to the invention. there are an n-channel part(11) and a p-channel part(12) in which they hold a floating gate in common. "A" indicates a source/drain region(an active region) and "B" indicates a floating gate region, and "C" shows a control gate region. Also, a first metal line(21), a second metal line(22), and a third metal line(23) are used for ground, a data out terminal(Vout), and a voltage supply terminal(Vdd), respectively.

Figure 3C:
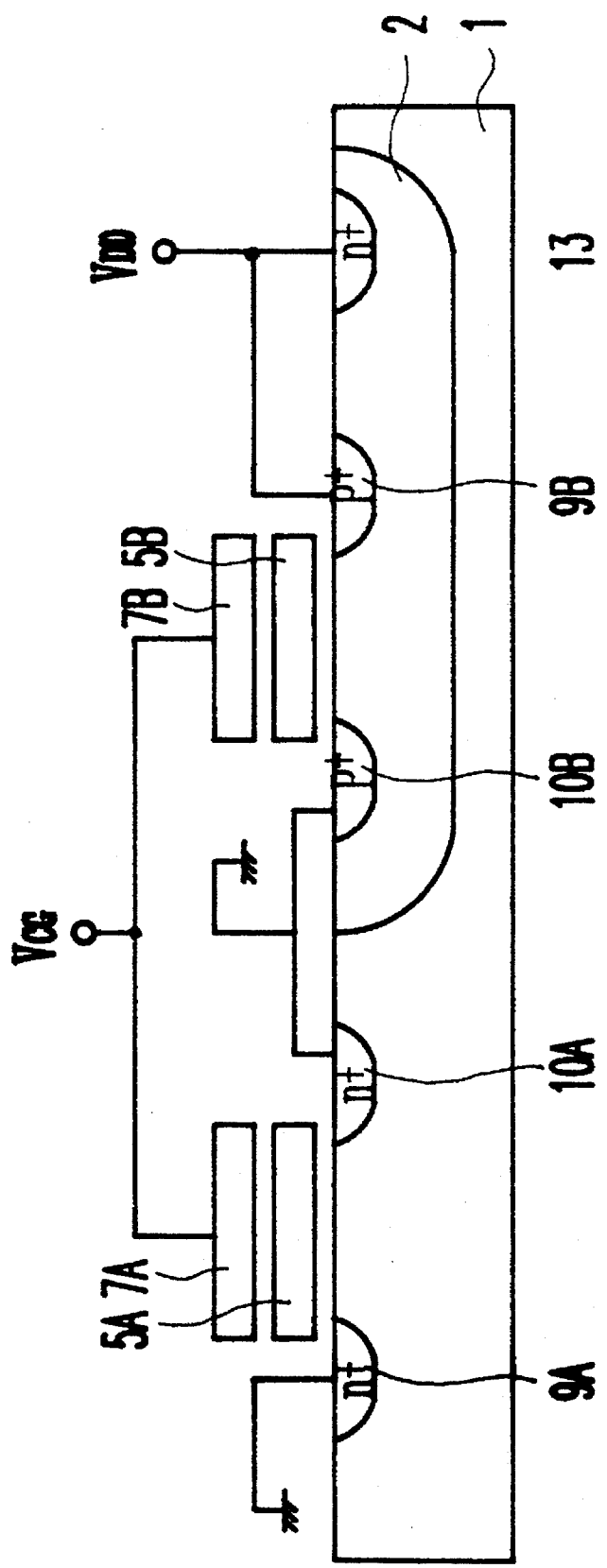

FIGS. 3A through 3C are cross-sectional views to show the bias conditions for the cell. Cell operations are explained with reference to FIG. 4A and FIG. 4B.

In FIG. 3A, when ground potential(Vss) is applied to the source(9A) of the n-channel part(11), 5 Volt is applied to the drain(10A), the drain(10B) of the p-channel part(12) is set to 5 Volt, the source(9B) and the pickup region(13) are set to 5 Volt, and the control gates(7A and 7B) of the n-channel part(11) and the p-channel(12) are set to a high voltage of about 12 Volt as bias conditions to program the n-channel part(11), then drain current flows through the n-channel(14) of the n-channel part(ll)(at this time, the p-channel is cut off and there is no current flow). In the above conditions, a high electric field caused by channel pinch-off is formed in the drain region(10A) of the n-channel part(11), whereby hot electrons are produced, and the floating gate(SA) is charged with electrons. When a threshold voltage(Vtxn) is raised in the n-channel part(11) by the charged electrons, relations with a threshold voltage(Vtxp) in the p-channel part(12) will be described as below using a simple capacitance model of FIG. 4A and FIG. 4B.

$$Vfg = K \times Vcg + Qn/Ct \quad \text{(equation 1)}$$

$$Vtn = K \times Vtxn + Qn/Ct \quad \text{(equation 2)}$$

where, Vfg is a potential that is induced to the floating gate by charge coupling, Vcg is a voltage applied to the control gate, Qn is total charges stored the floating gate by programming(Qn<0), Vtn is a threshold voltage of the n-channel part in the floating gate, Vtp is a threshold voltage of the p-channel part in the floating gate, Vtxn is a threshold voltage of the n-channel part in the control gate, Vtxp is a threshold voltage of the p-channel part in the control gate, Ct is a parallel capacitance of Cp(capacitance between the control gate and the floating gate) and Cox(capacitance between the floating gate and the silicon substrate), and K is a coupling ratio(Cp/Ct).

From the above two equations, the threshold voltage Vtp of the p-channel part is given by $$\begin{aligned} Vtp &= K \times Vtxp + Qn/Cox \\ &= K \times Vtxp + (Vtn - K \times Vtxn) \end{aligned} \quad \text{(equation 3)}$$

That is, the relation between Vtxp and Vtxn is expressed by $$Vtxn - Vtxp = (Vtn - Vtp)/K \quad \text{(equation 4)}$$

As one example, when Vtn is 0.7 Volt, Vtp is −0.7 Volt, K is 0.5, and Vtxn is 3.5 Volt with the program of the n-channel part, then from the equation 4, Vtxp of the p-channel part becomes $$\begin{aligned} Vtxp &= Vtxn - (Vtn - Vtp)/K \\ &= 3.5 \text{ Volt} - (0.7 \text{ Volt} + 0.7 \text{ Volt})/0.5 \\ &= 0.7 \text{ Volt} \end{aligned}$$

And when the p-channel part is programmed with Vtxp of −3.5 Volt, Vtxn becomes $$\begin{aligned} Vtxn &= -3.5 \text{ Volt} + (0.7 \text{ Volt} + 0.7 \text{ Volt})/0.5 \\ &= -0.7 \text{ Volt} \end{aligned}$$

In FIG. 3B, when ground potential(Vss) is applied to both the source(9A) and the drain(10A) of the n-channel part(11), about −7 Volt is applied to the control gate(7A), ground potential(Vss) is applied to the drain(10B) of the p-channel part(12), and the source(9B) and the pickup region(13) are set to 5 Volt as bias conditions to program the p-channel part(12), that is, to erase the EEPROM cell of an inverter type, then the floating gate(5B) of the p-channel part(12) is programmed through a p-channel(14) connecting to the source(9B) of the p-channel part(12).

Figure 4A:
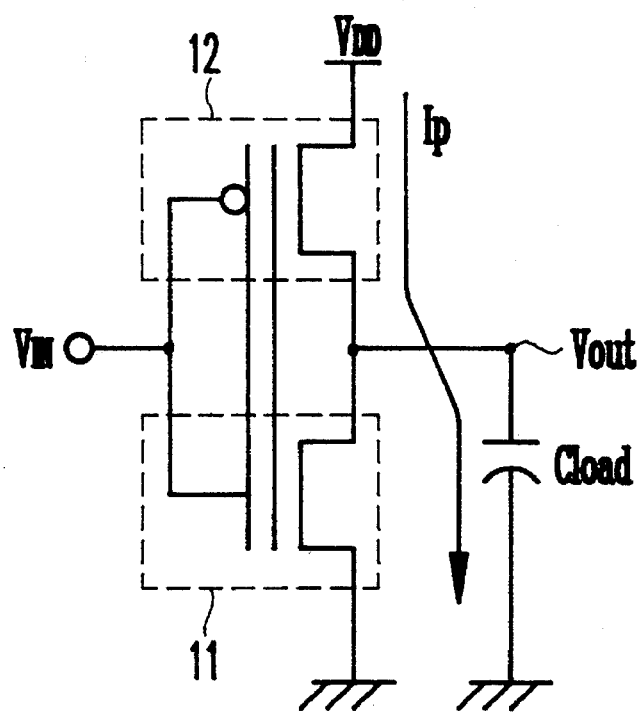
FIGS. 4A and 4B are schematic diagrams of the cell for explaining a read operation.
Figure 4B:
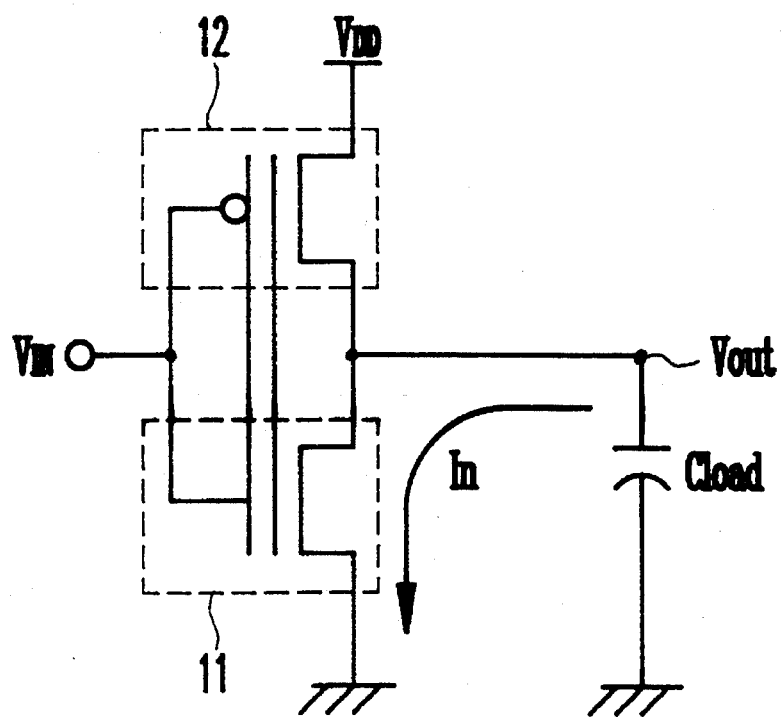

Referring FIG. 3C, as bias conditions for a read operation of the cell, when ground potential(Vss) is applied to the source(9A) of the n-channel part(11), about 2.5 Volt is applied to the control gate(7A), the control gate(7B) of the p-channel part(12) is set to about 2.5 Volt, and the source(9B) and the pickup region(13) are set to 5 Volt, then data stored in the cell can be read. That is, as shown in FIGS. 4A and 4B, in case that the n-channel part(11) and the p-channel part(12) compose an inverter in the cell, a read operation is as below. Assuming that the n-channel part(11) was programmed, the n-channel part(11) is turned off and the the p-channel part(12) is strongly turned on in a read operation, whereby a capacitor($C_{Load}$) is charged with p-channel cell current(Ip) so that an output(Vout) becomes a high level of 5 Volt. On the contrary, assuming that the p-channel part(12) in FIG. 4B was programmed, the output(Vout) becomes a low level of 0 Volt with n-channel cell current(In). As a result, a very high driving capability of the inverter makes it possible to read out data at high speed.

As described above, as the flash EEPROM in accordance with the present invention has an inverter structure in which the n-channel part and the p-channel part hold a floating gate in common, it makes possible both read and write operation at high speed because it uses hot carriers in reading as well as writing. Futhermore, the fact that the cell itself has the inverter structure is capable of reading data at high speed even without an additional sense amplifier. And it also gives a high noise immunity resulting from the inverter characteristics. An additional merit is that the cell has a high reliability in storing data to the cell because one cell is composed of a pair of an n-channel part and a p-channel part.

The foregoing description, although described in its preferred embodiment with a certain degree of particularity, is only illustration of the principle of the present invention. It is to be understood that the present invention is not to be limited to the preferred embodiments disclosed and illustrated herein. Accordingly, all expedient variations that may be made within the scope and spirit of the present invention are to be encompassed as further embodiments of the present invention.

What is claimed is:

1. A flash EEPROM cell, comprising:

a first source and a first drain formed in a p-type silicon substrate:

a second source and a second drain formed in an n-well of said p-type silicon substrate, with said second source connecting to said first drain;

a first tunnel oxide and a second tunnel oxide formed on said p-type silicon substrate between said first source and said first drain, and said p-type silicon substrate between said second source and said second drain respectively;

a first floating gate and a second floating gate formed on said first and second tunnel oxides, respectively, wherein said first floating gate is connected to said second floating gate;

a first insulating film and a second insulating film formed on said first and second floating gates, respectively; and a first control gate and a second control gate formed on said first and second insulating films, respectively, with said first control gate connecting to said second control gate.

\* \* \* \* \*